(12) United States Patent
Hilliard

(10) Patent No.: US 12,426,182 B2
(45) Date of Patent: Sep. 23, 2025

(54) CABLE DOCK

(71) Applicant: LENOVO (SINGAPORE) PTE. LTD., Singapore (SG)

(72) Inventor: Matthew Sean Hilliard, Morrisville, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 169 days.

(21) Appl. No.: 18/146,373

(22) Filed: Dec. 24, 2022

(65) Prior Publication Data

US 2024/0215187 A1    Jun. 27, 2024

(51) Int. Cl.
*H05K 5/02* (2006.01)
*G06F 1/16* (2006.01)

(52) U.S. Cl.
CPC ......... *H05K 5/0247* (2013.01); *G06F 1/1632* (2013.01)

(58) Field of Classification Search
CPC .......................... G06F 1/1632; H05K 5/0247
See application file for complete search history.

(56) References Cited

U.S. PATENT DOCUMENTS

| 2008/0002355 | A1* | 1/2008 | Carnevali | G06F 1/16 361/679.41 |
| 2013/0160246 | A1* | 6/2013 | Hajduch | H02G 3/32 24/16 PB |
| 2014/0021309 | A1* | 1/2014 | Rouleau | H02G 3/32 248/69 |
| 2017/0292634 | A1* | 10/2017 | Nguyen | F16M 13/02 |
| 2019/0036314 | A1* | 1/2019 | Toll | H02G 3/0456 |

\* cited by examiner

*Primary Examiner* — Allen L Parker
*Assistant Examiner* — Peter Krim
(74) *Attorney, Agent, or Firm* — Brian J. Pangrle

(57) ABSTRACT

A cable dock can include a base that includes a series of cable bays, where each of the cable bays includes a corresponding well intersected by a cross-member, where the well and the cross-member form a cable tie passage for receipt of a cable tie. A system can include a display base that includes an arm; a display mounted to the arm; and a cable dock.

19 Claims, 12 Drawing Sheets

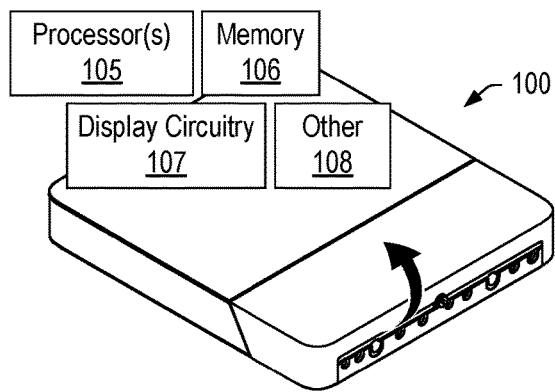
FIG. 1A
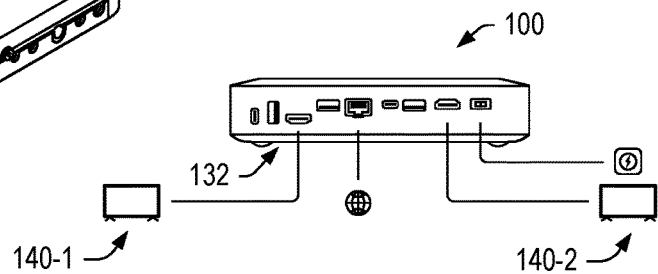
FIG. 1B
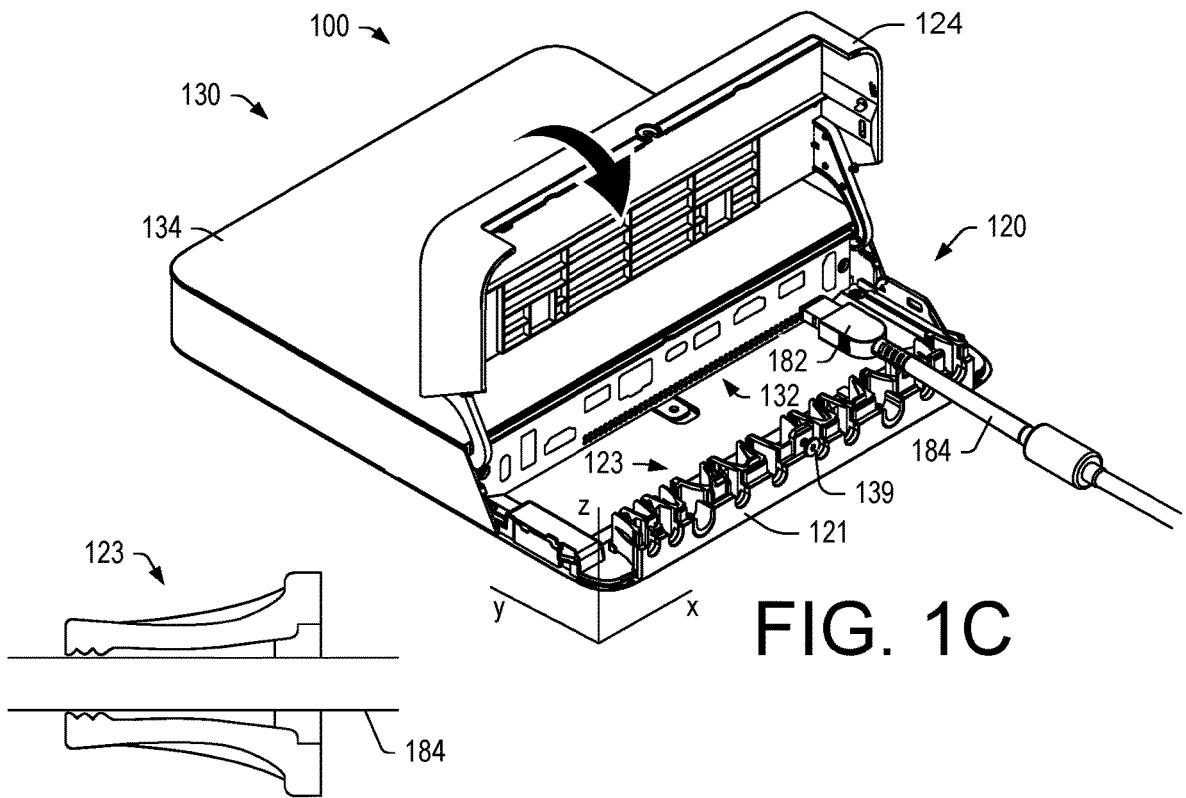
FIG. 1C
FIG. 1D

CABLE DOCK

TECHNICAL FIELD

Subject matter disclosed herein generally relates to docks for computing and display devices.

BACKGROUND

A cable dock can secure one or more cables for a computing device, a display device, or another electronic device.

SUMMARY

A cable dock can include a base that includes a series of cable bays, where each of the cable bays includes a corresponding well intersected by a cross-member, where the well and the cross-member form a cable tie passage for receipt of a cable tie. A system can include a display base that includes an arm; a display mounted to the arm; and a cable dock. A system can include a computer that includes a housing; and a cable dock mounted to the housing. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

FIG. 1A, FIG. 1B, FIG. 1C and FIG. 1D are views of an example of a system with an example of a cable dock;

DETAILED DESCRIPTION

Figure 2:
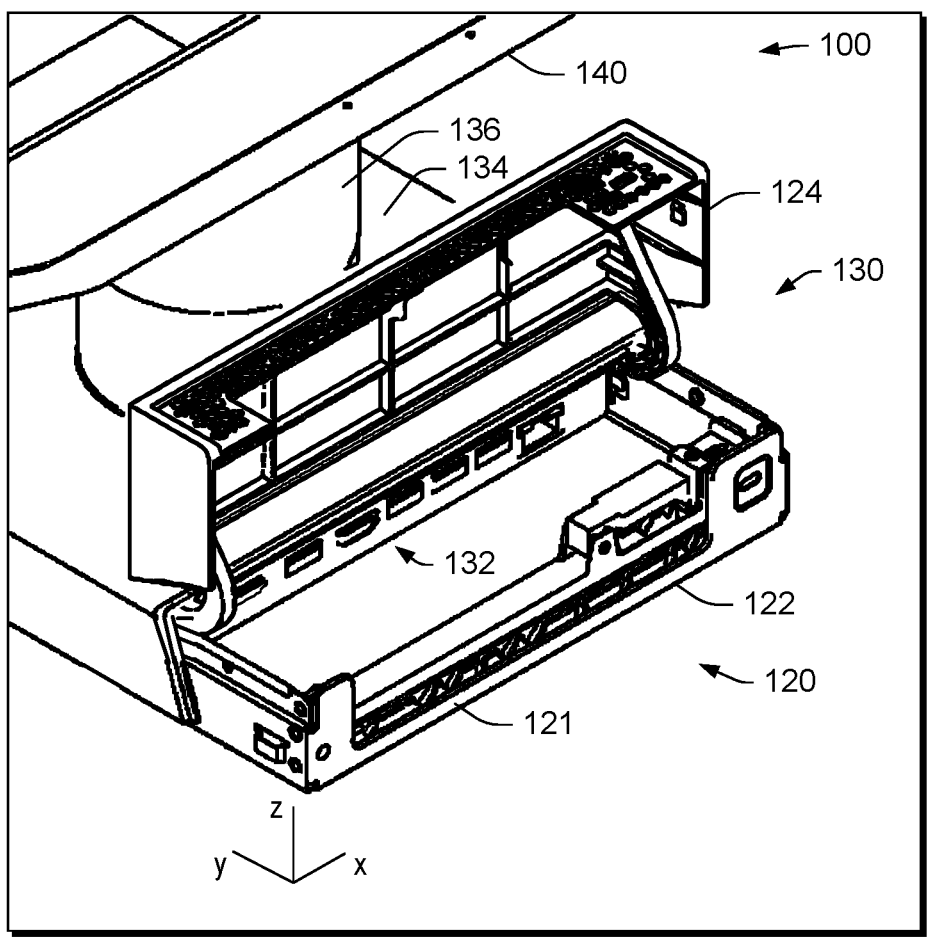
FIG. 2 is a perspective view of a portion of an example of a system with an example of a cable dock.

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

FIG. 1A, FIG. 1B and FIG. 1C show views of an example of a system 100 that can include one or more processors 105, memory 106 accessible to at least one of the one or more processors 105, display circuitry 107 and one or more other components 108, which can include electronic circuitry, instructions stored in the memory 106 and executable by at least one of the one or more processors 105, etc. As an example, the system 100 can include one or more batteries such as, for example, one or more lithium-ion batteries that can be rechargeable. As an example, the system 100 may include one or more accessories, peripherals, etc.

As shown in FIG. 1B, the system 100 can include and/or operatively couple to one or more display assemblies 140-1 and 140-2, each with a display that may utilize one or more technologies (e.g., LED, LCD, etc.). A display assembly can include a display side, a back side and a frame. The display circuitry 107 can be operatively coupled to at least one of the one or more processors 105, for example, to receive data, instructions, etc., for rendering text, graphics, images, etc., to one or more of the one or more display assemblies 140-1 and 140-2.

As an example, the display circuitry 107 can include one or more graphics processing units (GPUs) and, for example, one or more of the one or more processors 105 can be a central processing unit (CPU). As an example, the display circuitry 107 can include input circuitry such as touch circuitry, digitizer circuitry, etc., such that a display side can be an input surface. As an example, a display assembly can include a touchscreen display where a finger, a stylus, etc., can be utilized; noting sensing as to input may occur with or without physical contact between a finger and the display side, between a stylus and the display side, etc., depending on the type of input circuitry utilized (e.g., resistive, capacitive, acoustic wave, infrared, optical, dispersive signal, etc.).

In the example of FIG. 1A, FIG. 1B and FIG. 1C, the system 100 can be or can include a base 130 that includes an upper surface 134. As shown, the base 130 includes a recess with connectors 132. As shown, a connector assembly 120 can include a number of clamps 123 for a number of cables 184 with corresponding connectors 182. As shown, one of the number of cables 184 can be received by one of the number of clamps 123 such that the connectors 182 can be connected to the connectors 132 of the base 130. Such an approach may provide for secure connections.

As to securing a cable and/or removing a cable, a tool may be used to turn a screw 139 such that a lid 124 can be pivoted upwardly about a hinge point (e.g., a hinge axis) to move the lid 124 away from a portion 121 of the base 130 that seats the number of clamps 123. A cable may then be pressed into one of the clamps 123 to secure it. As shown, the number of clamps 123 may be sized differently such that individual components of each of the number of clamps 123 may differ. Such an approach can involve making a number of clamp assemblies with different sized components, different clamping force, etc. Such an approach can complicate assembly of the system 100 as each clamp may demand seating in a particular seat, in a particular seat order, etc. As shown in the example of FIG. 1C, a Cartesian coordinate system with x, y and z coordinates can be utilized to define one or more features of the system 100. For example, the number of clamps 123 may be arranged in series along a direction of an x-coordinate (e.g., x-axis) with depths along a direction of a y-coordinate (e.g., y-axis) and heights along a direction of a z-coordinate (e.g., z-axis). In such a coordinate system, the one of the number of cables 184 can be pressed downwardly in a direction of the z-axis to be pinched by two clamp portions of one of the number of clamps 123. As shown, the number of the clamps 123 is approximately 10 where regardless of cable diameter, the clamping force may be approximately the same, along with teeth of the two clamp portions being approximately the same (e.g., tooth length the same for a small cable diameter as for a larger cable diameter). As shown in the example of FIG. 1C, the number of clamps 123 are set a distance from the connectors 132, for example, to accommodate the connectors 182 of the number of cables 184. As to a method of installation, consider mating connectors (e.g., a cable connector with a system connector) followed by pushing a cable into a clamp such that teeth of the clamp apply a clamping force to the cable.

FIG. 2 shows another example of the system 100 where the connector assembly 120 includes a clamp 122 and an example of the lid 124 where the clamp 122 is positioned with respect to the portion 121 of the base 130 (e.g., seated in the portion 121). In the example of FIG. 2, the clamp 122 can be opened and closed to secure cables with connectors that may be connected to the connectors 132 of the base. In the example of FIG. 2, the lid 124 can be lifted to access the connectors 132 and may be closed to cover the connectors 132. In a closed position, the lid 124 may be even with the surface 132 of the base 130.

In the example of FIG. 2, the clamp 122 may be relatively easy to manipulate (e.g., to open and close via a hinged end); however, given the hinged arrangement of the clamp 122, force may be distributed unevenly to cables, particularly where cables may be of different sizes, materials, etc. For example, if a large diameter cable with a stiff material is positioned proximate to the hinged end of the clamp 122, then cables, which may be smaller and/or more elastic, a distance from the hinged end of the clamp 122 may be less secure, which may give rise to a risk of a disconnection between a connector of a cable and a connector of the base 130.

In the examples of FIG. 1A, FIG. 1B, FIG. 1C and FIG. 2, the base 130 and/or one or more display assemblies 140, 140-1 and 140-2 can be defined with respect to one or more coordinate systems such as, for example, one or more Cartesian coordinate systems (see, e.g., FIG. 1C and FIG. 2). As shown, the base 130 may be cuboid in shape with a side that includes the series of connectors 132. As an example, the base 130 and a display assembly may form an all-in-one (AIO) type of computing device. As an example, the series of connectors 132 can include power and/or data connectors. As an example, a connector may be a wired connector or an optical connector (e.g., for optical fiber). As an example, a connector may be one or more of a video connector, an audio connector, a power connector, a network connector, a peripheral connector, a security connector, a dongle connector, etc.

As an example, a system can include a hub device. For example, consider the THINKSMART HUB device, which may be pre-configured for conferencing tasks. Such a device can include integrated touch control, efficient functionality, purpose-built design, scalability across room sizes, security, and reliable support services from assessment through deployment. As an example, a system can include a hub device that includes one or more features of a device such as, for example, the THINKSMART CORE device.

As an example, a hub device can include an INTEL processor, a 11.6" touchscreen, 360° rotatable, 300 nits, 1920×1080 resolution, 16:9 aspect ratio, antiglare and smudge-resistant display, a storage device (e.g., 128 GB SSD), graphics circuitry (e.g., INTEL HD graphics), audio circuitry, microphones, and a variety of ports, which may be referred to as connectors.

As an example, a hub device can include connectors such as one or more of an HDMI-in, HDMI-out, RJ45, USB-A 3.0, 3.5 mm combination microphone/audio-out stereo jack, LAN, power, USB-X (e.g., A, B, C, etc.), etc.

As to dimensions, as an example, a hub device with a display may be approximately 280 mm×200 mm×175 mm and a hub device without a display may be approximately 37.5 mm×226 mm×200 mm (e.g., z-axis, y-axis, x-axis). As an example, a hub device may weigh approximately 0.25 kg to 2.5 kg or more. As an example, a hub device can include an IR-based human proximity sensor. As an example, a hub device may include a VESA mount and/or another type of mount.

As explained, a hub device may include one or more cable management features. As an example, a cable management feature may be a secure lock, for example, consider a keyed lock for a lid.

Figure 3:
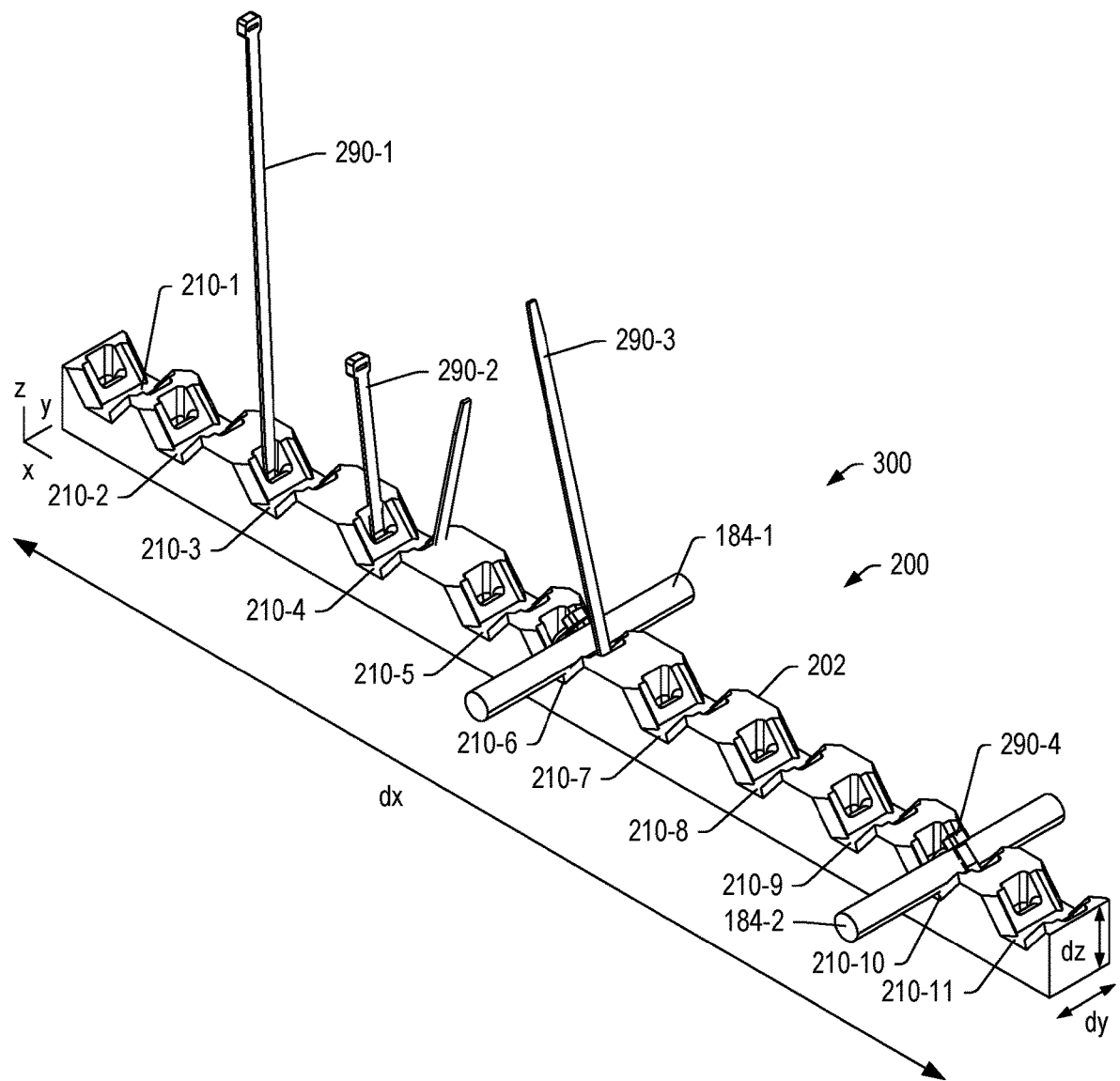
FIG. 3 is a perspective view of an example of a system that includes an example of a cable dock.

FIG. 3 shows a perspective view of an example of a system 300 that includes one or more cables 184-1 and 184-2 and a cable dock 200 that can include a base 202 that includes a series of cable bays 210-1, 210-2, 210-3, 210-4, 210-5, 210-6, 210-7, 210-8, 210-9, 210-10 and 210-11, where each of the cable bays includes a corresponding well intersected by a cross-member, where the well and the cross-member form a cable tie passage for receipt of a cable tie. For example, the cable dock 200 is shown along with cable ties 290-1, 290-2, 290-3 and 290-4 as received by cable tie passages of cable bays 210-3, 210-4, 210-6 and 210-10, respectively, where the cable 184-1 is seated in the cable bay 210-6 and the cable 184-2 is seated in the cable bay 210-10. In the example of FIG. 3, the base 202 may defined at least in part using a Cartesian coordinate system. For example, the base 202 can have a length dx along an x-axis, a depth dy along a y-axis and a height dz along a z-axis, where dy and dz may be approximately the same where dx can depend on the number of cable bays.

As an example, a cable tie can be utilized to provide some amount of security. For example, a base with a cable dock may be coupled to a number of cables where the cables may be relatively long and/or fixed at one or more points beyond the base. Where cable ties are utilized to secure cables, it may be difficult to remove a cable in a tool-less manner. For example, to remove a cable tie, a user may need some type of cutting tool (e.g., a knife, a snipper, a scissors, etc.). Thus, where cable ties are utilized, a person that aims to remove a base from its location may be dissuaded upon discovering that cables are secured to the base with cable ties.

A cable tie may be made of a polymeric material such as, for example, NYLON material (e.g., polyamide), a polypropylene material, etc., and include a flexible tape section with teeth that engage with a pawl in a head to form a ratchet such that as the free end of the tape section is pulled the cable tie tightens and does not come undone. Some ties can include a tab that can be depressed to release the ratchet such that the tie can be loosened or removed, and possibly reused. As an example, a cable tie may have a width (e.g., consider 1 mm to 20 mm) and a length (e.g., 50 mm to 1000 mm). As shown in FIG. 3, a cable bay may provide for accommodating a range of widths. For example, consider a range from 1 mm to 5 mm or, for example, from 1 mm to 10 mm. As an example, a range can provide for accommodating cables that may be types of cables commonly utilized with a hub device. In such an approach, a user may select a cable tie in a manner that can depend on cable diameter, cable materials, minimum cable bend radius, cable structure, cable current rating, cable conductor size(s), etc.

As an example, a cable tie may be selected in a manner that reduces risk of cable damage for an amount of applied pressure, which may be, for example, specified according to a manufacturer of a cable where a cable tie may be rated as well. As to an example of a cable tie rating, consider a NYLON cable tie with a length of 80 mm, a width of 2.4 mm suitable for a maximum diameter of 15 mm with a tensile strength of 80 N (e.g., 18 lbs).

As an example, a holding force applied to a cable in a cable bay may be greater than a pull force of a connector of the cable such that risk of disconnection is reduced. For example, if a holding force was less than a pull force, a cable may slide in a cable bay upon pulling on the cable with its pull force and result in disconnection of a connector of a cable. As an example, a cable for a smart phone (e.g., IPHONE device) may take about 5 N of pulling force to disconnect, noting that various types of USB cables may have a pulling force (0 degrees) in a range from 1 N to 10 N or more. As an example, a holding force may be based in part on mass of a hub device and/or how it is mounted. As an example, a holding force may be greater than 1 N, greater than 5 N, greater than 10 N, greater than 20 N, at least 45 N, etc. As an example, a manufacturer of equipment may specify a holding force.

As an example, a cable bay can include one or more features that can provide for holding a cable with a suitable holding force, which can be one or more features in addition to a cable tie. For example, a cable bay may include one or more detents (e.g., ridges, etc.) that can be shaped to deform an outer resilient layer of a cable. Such one or more features may provide for a suitable holding force where a cable tie may apply pressure to engage such one or more features (see, e.g., FIG. 8). As an example, one or more detents may facilitate meeting a holding force requirement without applying excessive force to a cable.

Figure 4:
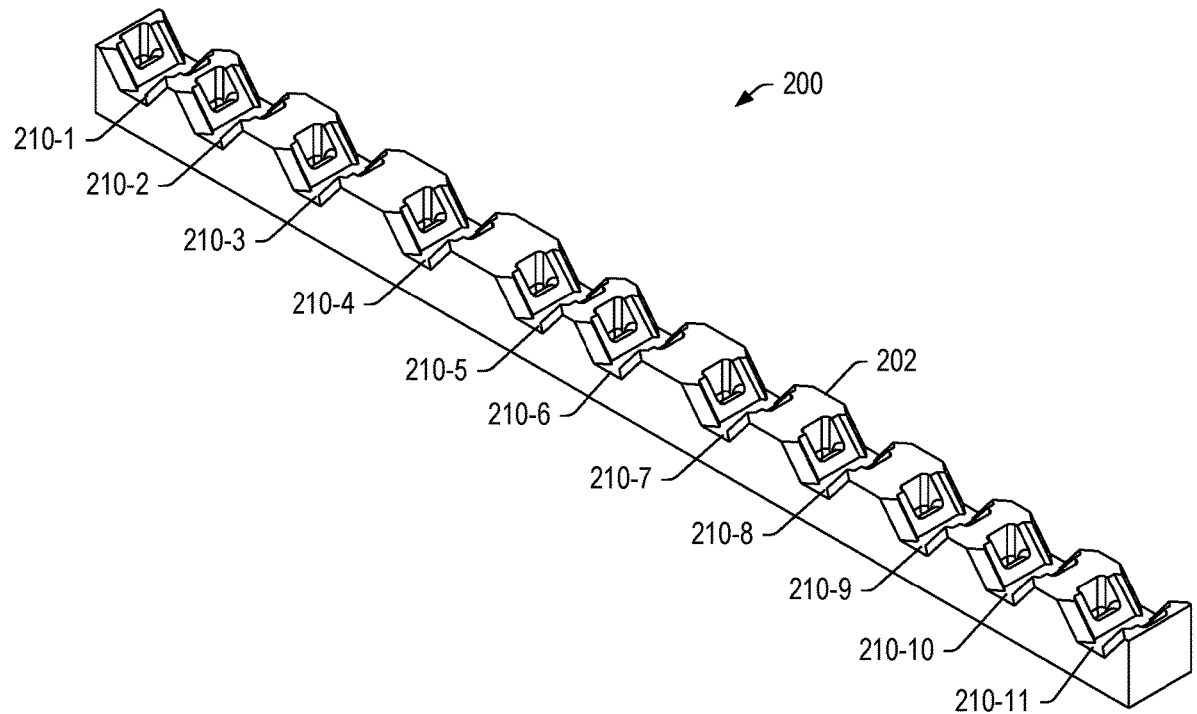
FIG. 4 is a perspective view of the cable dock of FIG. 3.

FIG. 4 shows a perspective view of the cable dock 200 without cables and without cable ties. As shown, cable bays of the base 202 may be arranged in series, which may be a linear series with, for example, at least four cable bays.

Figure 5:
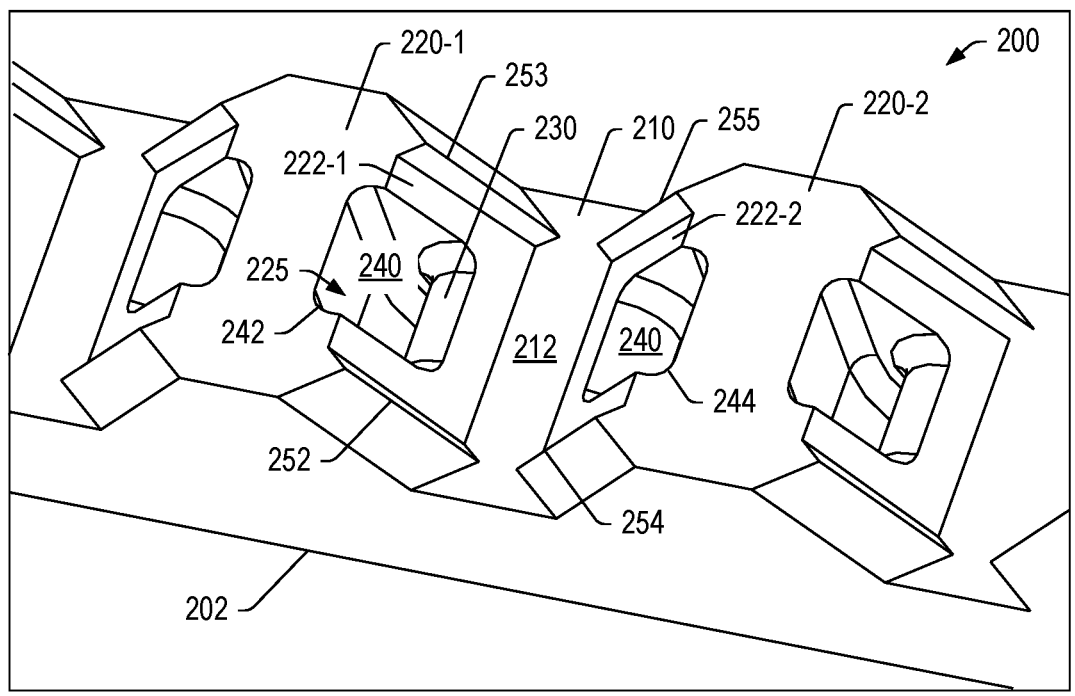
FIG. 5 is a perspective view of a portion of an example of a cable dock.

FIG. 5 shows a perspective view of a portion of the cable dock 200. As shown, the cable bay 210 can be formed by a platform 212 and a pair of pillars 220-1 and 220-2, one to either side of the platform 212. As shown, the pair of pillars 220-1 and 220-2 has slanted sides 222-1 and 222-2 that extend outwardly from the platform 212. As shown, each of the slanted sides 222-1 and 222-2 can include an opening 242 and 244, respectively, which opens to a cable tie passage 240 as formed in part by the base 202 and in part by a cross-member 230. For example, the base 202 can include a well 225 where the cross-member 230 intersects the well 225 to form the cable tie passage 240. In such an example, a boundary of the well 225 can guide a cable tie and a boundary of the cross-member 230 can be surface for binding of a cable tie.

As shown in the example of FIG. 5, the sides 222-1 and 222-2 can include one or more detents 252 and 253 and one or more detents 254 and 255, respectively. In such an example, the detents 252, 253, 254 and 255 can be pointed, for example, by having a beveled shape that ends at a point (e.g., in cross-section). A cable may have an outer layer that can be elastomeric such that a detent may indent the outer layer, which can help secure the cable, for example, to hinder axial movement of the cable. A cable tie may be positioned about a cable where a pair of detents is positioned to one side of the cable tie and another pair of detents is positioned to another side of the cable tie. In such an example, as tension is increased on the cable tie, a cable may become more deeply seated in a cable bay where detents may more securely grip the cable to hinder movement thereof.

Figure 6:
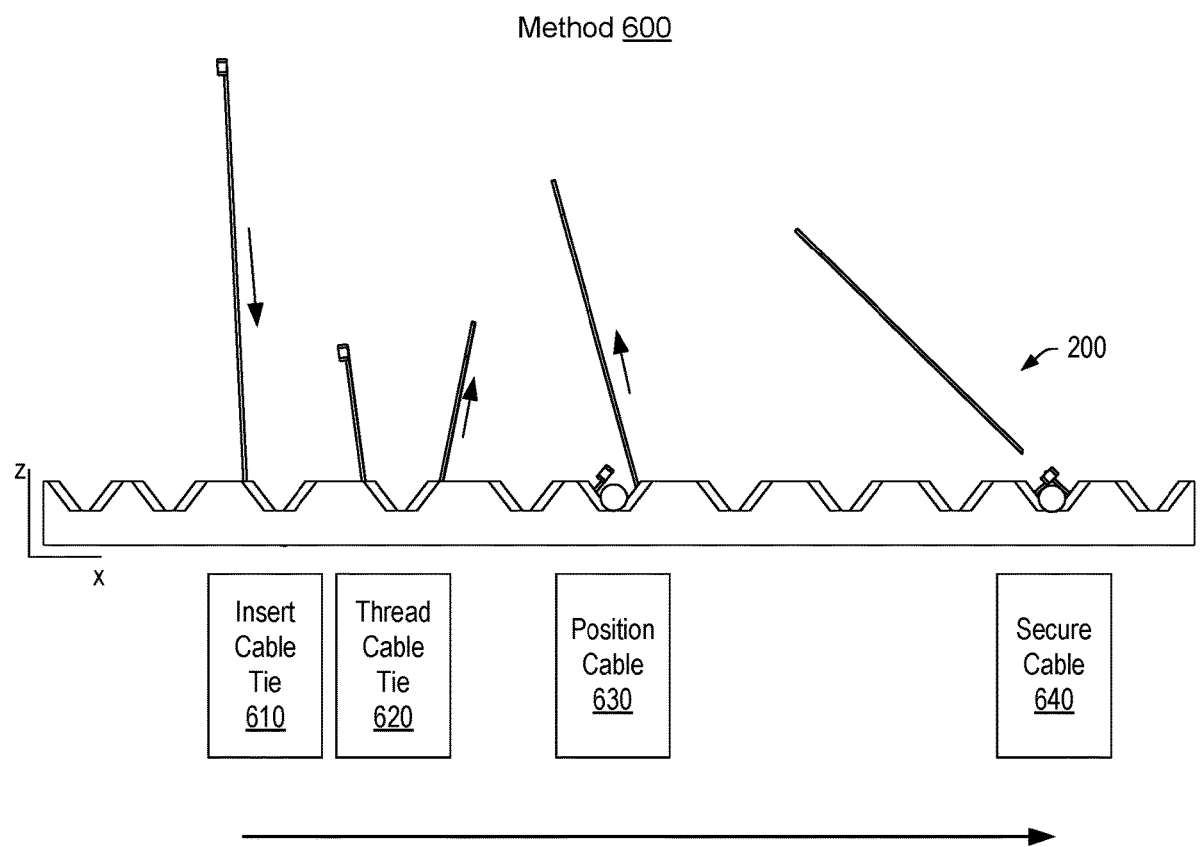
FIG. 6 is a diagram of a method with respect to an example of a cable dock.

FIG. 6 shows an example of a method 600 with respect to an example of the cable dock 200, a number of cable ties and a number of cables. As shown, the method 600 can include inserting a cable tie into an opening of a cable tie passage of a cable bay of the cable dock 610, threading the cable tie through the cable tie passage of the cable bay 620, positioning a cable in the cable bay 630, and securing the cable in the cable bay using the cable tie 640. As shown, an excess portion of the cable tie may be cut such that the excess portion does not interfere with one or more objects.

As explained, a cable bay can have an associated cable tie passage that may be formed by a well and a cross-member. The shape of the cable tie passage can facilitate threading of a cable tie and can also help secure a cable tie with respect to a cable. As an example, a cross-member may be shaped to provide for even distribution of stress such that a cable tie does not experience sharp corners.

Figure 7:
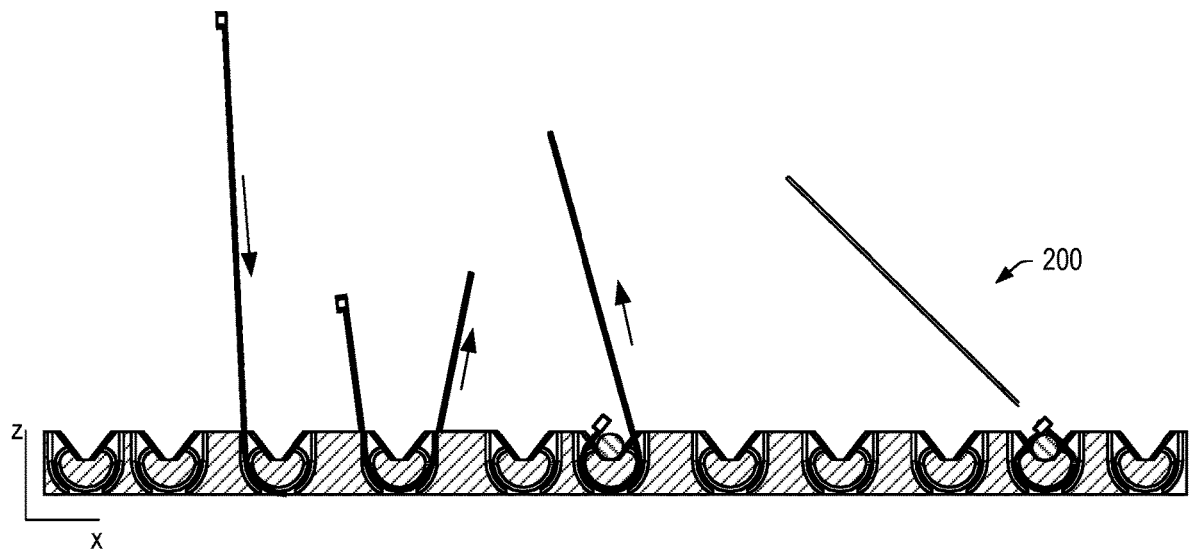
FIG. 7 is a cross-sectional view of an example of a cable dock.

FIG. 7 shows a cross-sectional view of an example of the cable dock 200 as shown in FIG. 6, with respect to the method 600. In FIG. 7, cable tie passages are visible along with cable ties disposed at least in part in their respective cable tie passages. In the cable bay that is second from the right, a cable is secured where the cable tie forms a substantially circular shape, which may be a substantial teardrop shape (e.g., a circle with a cusp or a point). In the example of FIG. 7, the cable is securely seated in the cable bay where the top of the cable does not extend outwardly above a top side of the cable dock; noting that a portion of the cable tie may extend outwardly beyond the top side of the cable dock.

Figure 8:
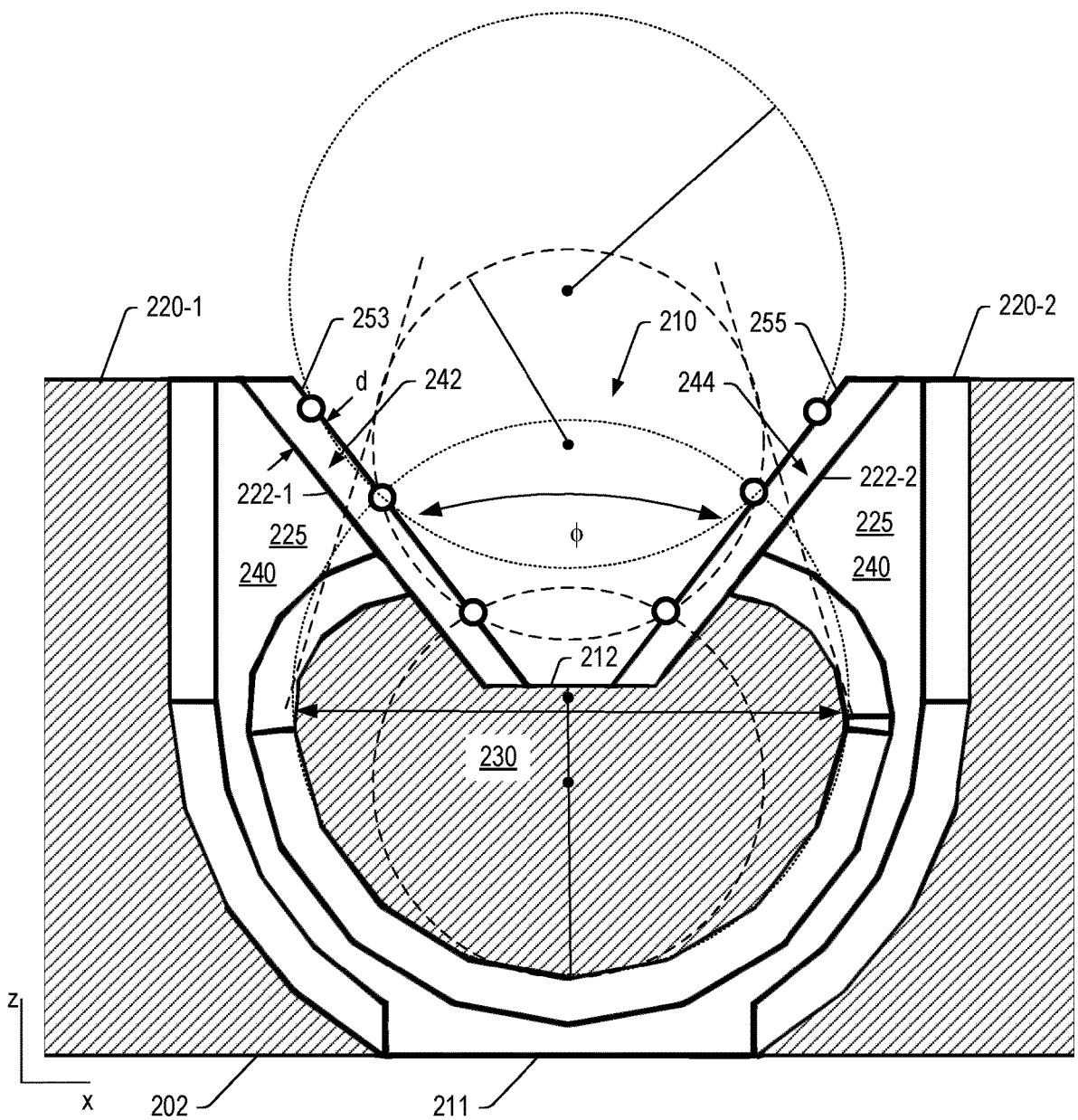
FIG. 8 is a cross-sectional view of an example of a portion of a cable dock.

FIG. 8 shows a cross-sectional view of an example of a cable bay as formed in a base 202 of a cable dock 200. As shown, an angle $\phi$ may be defined between the opposing sides 222-1 and 222-2. As mentioned, each of the sides 222-1 and 222-2 includes an opening 242 and 244, respectively, to the cable tie passage 240 as formed by the well 225 and the cross-member 230. In the example of FIG. 8, a z-axis and an x-axis are shown, which may be utilized to define one or more features (e.g., using x and z coordinates).

As an example, the cross-member 230 can include a cardioid shape that may be defined by one or more dimensions. In the example of FIG. 8, various circles are shown, including two dashed circles with a first radius and two dotted circles with a second, larger radius. The circles can represent a small diameter cable and a large diameter cable and may represent dimensions of the cross-member 230. As shown, tangents may be drawn from the cross-member 230 at a widest dimension where the tangents can also be tangent to a cable with a radius equal to the first radius. In such an example, stress on a cable tie may be reduced.

As an example, a cable tie that is tied (e.g., connected to itself) can form a hoop that may define a hoop stress. Hoop stress is the stress that occurs along a circumference when pressure is applied. Hoop stress acts perpendicular to the axial direction. Hoop stresses are tensile and generated to resist a bursting effect that results from the application of pressure.

In the example of FIG. 8, an opening 211 is shown in the bottom of the base 202, which may be a bottom well opening (e.g., an opening in the well 225). Where the base 202 is disposed on a flat surface, the opening 211 can be closed where the surface may act to guide a cable tie being threaded into the cable tie passage 240.

In the example of FIG. 8, open circles are shown as contact points between a cable and the detents 253 and 255. As shown, the cable bay 210 can accommodate a cable with a radius equal to the second radius; however, that may be at or near a limit for a cable tie with respect to the cable tie passage 240. As an example, the cable bay 210 may accommodate cables with lesser radii, which may include, for example, cables with radii lesser than the first radius. As to a smallest radius, it may be approximately a dimension of the platform 212 between the detents 253 and 255. For example, a smallest diameter cable may be seated in the cable bay 210 where a top of the cable is at least as high as a highest point of the cross-member 230 such that a cable tie, once threaded into the cable tie passage and secured, contacts the cable.

As shown in the example of FIG. 8, a distance, d, between the detent 253 and the side 222-1, can be limited to reduce risk of cable damage. For example, the distance, d, may be in a range from 0.1 mm to 3 mm for a typical range of computer and/or display cables such that the detent 253 does not cut into a cable and damage a conductor, a fiber optic, etc., of the cable. In such an example, a smaller cable bay for a smaller diameter cable may have a lesser value of the distance, d, compared to a larger cable bay for a larger diameter cable. Such an approach to limiting a detent dimension can help to reduce risk of damage to a cable by one or more detents in the instance that a cable tie is somewhat overly tightened. As explained, a holding force (e.g., for a pulling action) may be provided through engagement of one or more detents with a cable upon application of force by a cable tie. In such an approach, force applied by the cable tie to a cable to engage one or more detents may be less than the force required to be applied by the cable tie to the cable in the absence of one or more detents. In various examples of cable bays, the presence of one or more detents (e.g., with appropriate shape, angle and dimension), along with a cable tie passage, can provide for a more consistent approach to holding a cable in a cable bay.

As to some examples of cables and detent dimensions, consider a USB cable outer diameter of approximately 3.5 mm where the distance, d, may be less than 1 mm and greater than 0.1 mm; a HDMI cable outer diameter of 5.7 mm where the distance, d, may be less than 2 mm and greater than 0.5 mm. As explained, a cable dock can include a series of cable bays where the cable bays can be sized according to associated ports (e.g., connectors). In such an approach, the sizing, visually and/or tactilely, may facilitate positioning of cables in appropriate cable bays. For example, a user may see that a larger diameter cable is to be seated in a larger cable bay and a smaller diameter cable is to be seated in a smaller cable bay where through such visual cues, the use may not have to examine associated ports (e.g., connectors) or such visual cues may help to confirm associations between cable types (e.g., sizes) and ports (e.g., connectors). While the distance, d, is shown with respect to the detent 253, it can be associated with one or more of the other detents (e.g., detents 252, 254 and 255), for example, detents may have the same distance, d. As an example, a detent may have a sloped profile whereby the distance, d, is greater near the top and lesser near the platform 212. In such an approach, a smaller outer diameter cable may be seated with its center axis near the platform 212 and be in contact with a shallower detent distance while a larger outer diameter cable may be seated with its center axis a further distance from the platform 212 and be in contact with a deeper detent distance. As an example, each cable bay may be specified with a range of cable sizes, which may be specified according to cable outer diameter (e.g., 1 mm to 3 mm, 3 mm to 5 mm, 5 mm to 7 mm, etc.). As an example, a cable bay may be configured with detents, an angle between opposing sides and a platform that can accommodate a desired range of cable outer diameters.

In the example of FIG. 8, the well 225 and the cross-member 230 are shown as including fillets that can help make the cable tie passage smoother (e.g., without or with fewer sharp edges, etc.). Such an approach can help in guiding one or more cable ties through the cable tie passage 240.

As to the angle ϕ, it may be greater than approximately 45 degrees and less than approximately 135 degrees. As shown, the cable bay 210 can have a substantial V-shape, as formed by the opposing sides 222-1 and 222-2 and, for example, the platform 212, which may be a surface of the cross-member 230.

In the example of FIG. 8, the detents 253 and 255 may be appropriately dimensions, for example, in combination with the angle ϕ, which may provide for a depth of recessed area from an edge of the detents 253 and 255 to their respective sides 222-1 and 222-2, which may, for example, help to control how much bite a cable bay can provide to a cable. As an example, one or more features of a base and a cable bay thereof can be tailored to reduce cable damage from over tightening of a cable tie. For example, by limiting the distances between a surface and an outer edge of a detent, the distance that a detent bites into a cable may be controlled. In such an example, the distance may be controlled to be less than an annular dimension of an outer layer of a cable (e.g., to prevent biting into a wire or wires).

As an example, a cable bay can include a V-shaped ridge with a pointed edge that securely grabs a cable as a cable tie clinches down on the cable and a portion of the cable bay (e.g., a cross-member). In such an example, the depth of a recessed region adjacent to the ridge can control how much bite a ridge can have on a cable, where a ridge can be dimensioned and/or shaped to reduce risk of cable damage from overtightening of a cable tie. Upon biting, the ridge may form a groove or indentation in an outer surface of a cable. As explained, a detent can be a ridge, which may have a V-shape (e.g., in cross-section), with a suitable angle and a suitable depth. As explained, a cable bay can include a V-shape intersected by a platform where, for example, detents can be present along a portion or portions of the V-shape. In various examples, a cable bay can include four ridges (e.g., four detents) where two are to one side and two are to another side of the cable bay where a surface between one pair and a surface between the other pair can limit deformation of a cable forcibly seated in the cable bay using a cable tie.

As explained, a cable bay can allow for a cable tie to be feed in on one side and come back out on another side of a cable such that the cable bay is ready for use. For example, as shown in FIG. 7, opposing ends of a cable tie can be angled to provide access to a cable bay such that the angled ends may also help to guide a cable into the cable bay. Once disposed in a cable bay, one end of the cable tie can be threaded through a pawl at the other end of the cable tie to thereby secure the cable tie and appropriately tension it to apply sufficient pressure to the cable such that the cable can engage one or more edges (e.g., pointed edges) of the cable bay. As an example, a cable dock may optionally be molded as a single component, for example, from a suitable polymeric material, metallic material, etc. As an example, a cable dock may be made of a non-conductive, electrically insulating material.

Figure 9A:
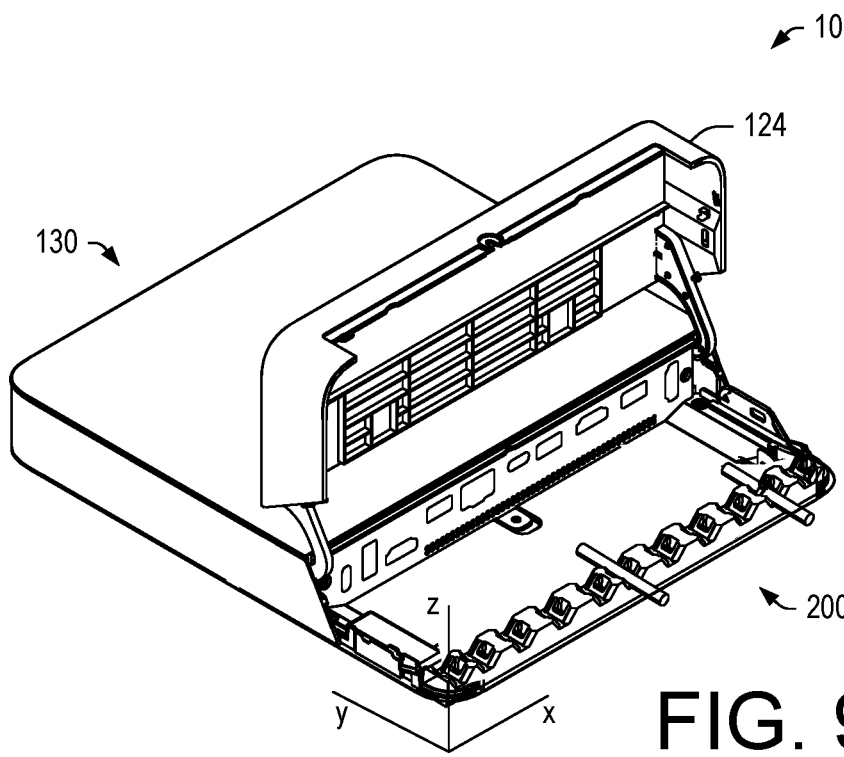
FIG. 9A and FIG. 9B are perspective views of examples of systems that include examples of cable docks.
Figure 9B:
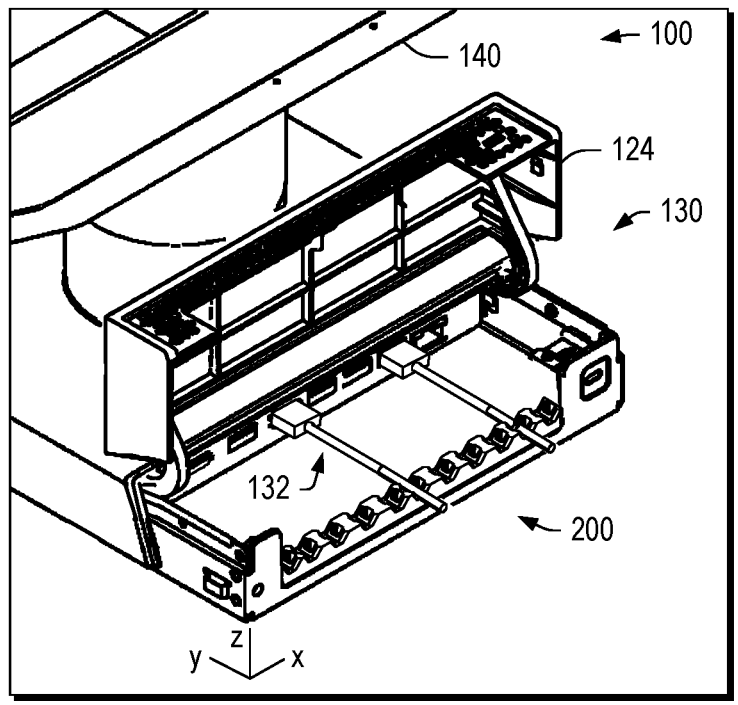

FIG. 9A and FIG. 9B show examples of systems 100 that include a base 130, optionally a display assembly 140, and an example of the cable dock 200. In FIG. 9A, the cable dock 200 may be accessible from a side of the base 130 and, in FIG. 9B, the cable dock 200 may be accessible from a side of the base 130. In the examples of FIG. 9A and FIG. 9B, the base 130 is shown as including the lid 124, which may be pivotable between an open position and a closed position. In an open position of the lid 124, various features of the cable dock 200 can be accessible, for example, to insert cables, insert cable ties, cut cable ties, remove cables, etc. As an example, the cable dock 200 may be integral to or coupled to a portion of the base 130. One or more features of the examples of FIG. 9A and FIG. 9B may be defined with respect to one or more coordinate systems (see, e.g., x, y and z Cartesian coordinate systems).

As an example, the system 100 of FIG. 9A and/or the system 100 of FIG. 9B can be or include a computer that includes a housing (see, e.g., the base 130); and a cable dock mounted to the housing, where the cable dock includes a base that includes a series of cable bays, where each of the cable bays includes a corresponding well intersected by a cross-member, where the well and the cross-member form a cable tie passage for receipt of a cable tie.

Figure 10:
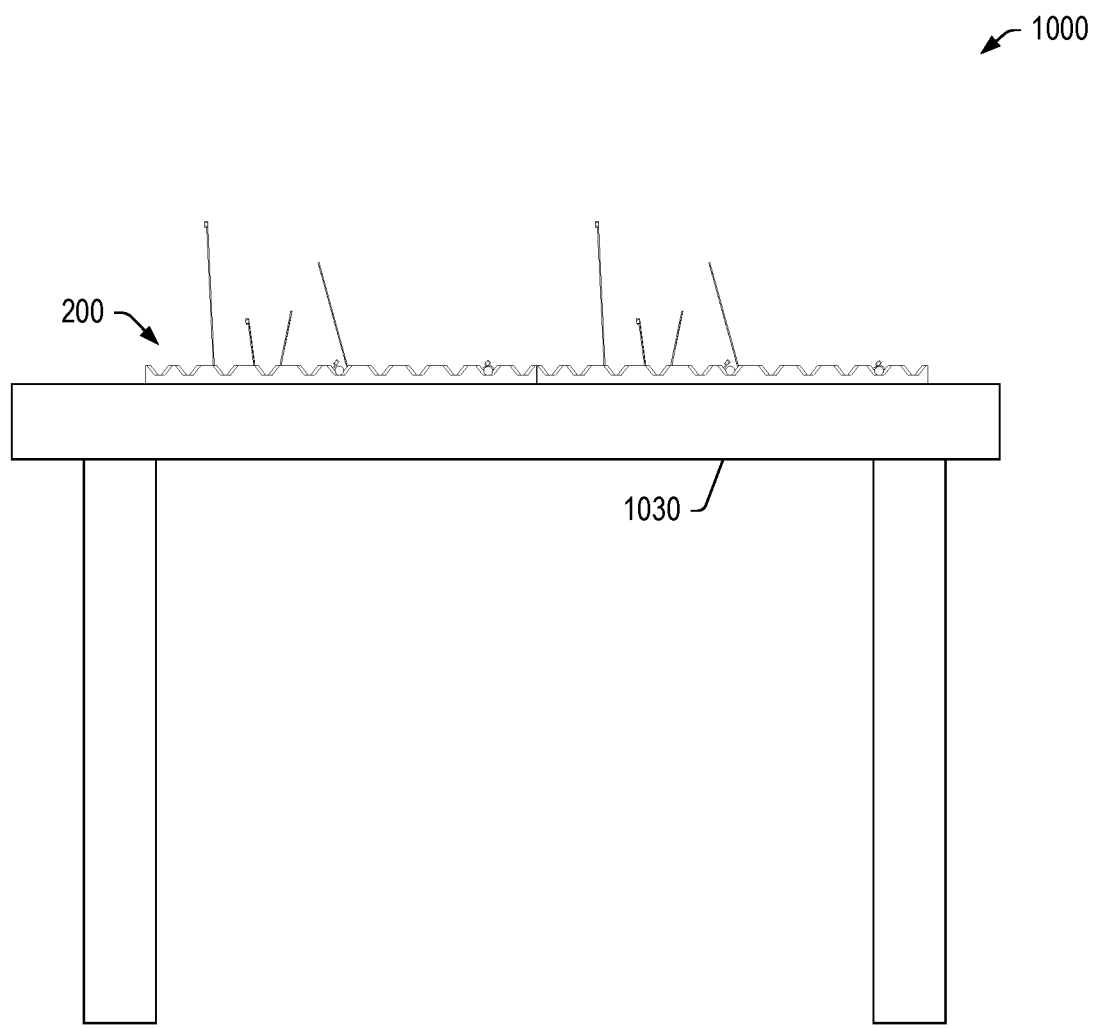
FIG. 10 is a side view of an example of a system that includes an example of a cable dock.

FIG. 10 shows an example of a system 1000 where an example of the cable dock 200 is positioned on a surface of a table 1030 (e.g., or desk, etc.). While a table is shown in the example of FIG. 10, consider, as an example, a cable dock that may be utilized with a server rack, for example, to secure cables that can be connected to a server. In such an example, the cable dock may be formed integrally with a component of the server rack or otherwise mounted to the server rack or, for example, be mounted to a server.

Figure 11A:
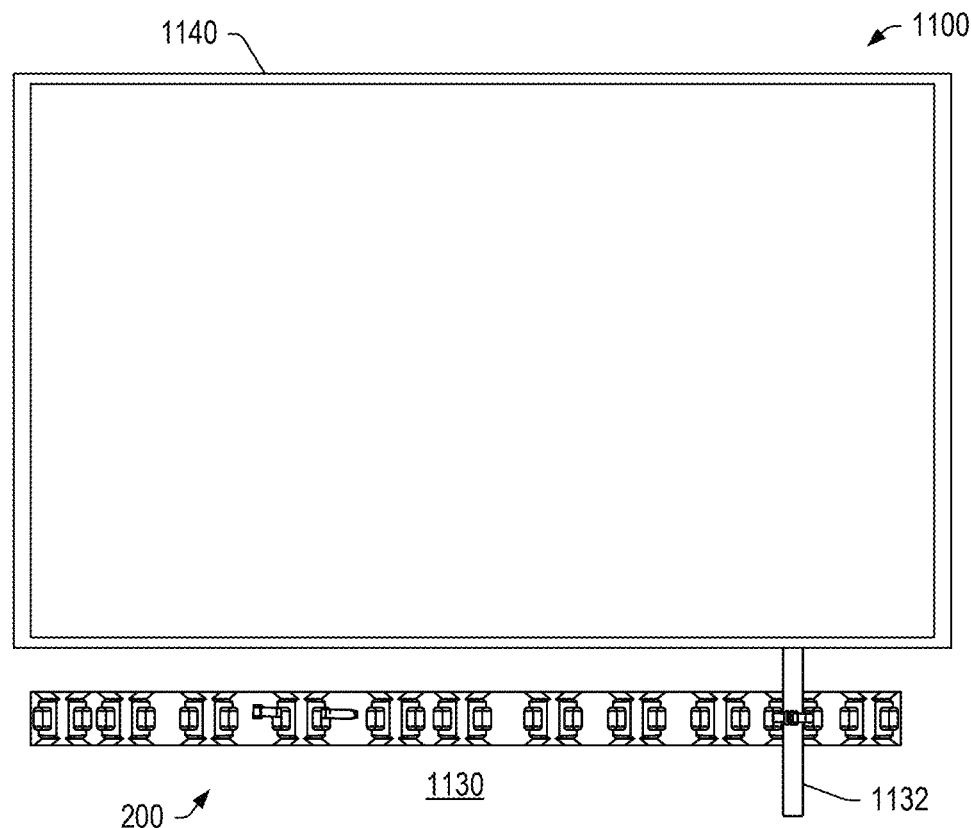
FIG. 11A and FIG. 11B are views of example of systems.
Figure 11B:
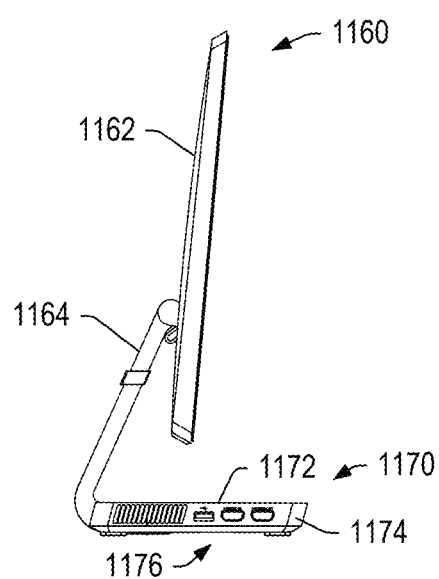

FIG. 11A shows an example of a system 1100 where an example of the cable dock 200 is positioned on a surface of a wall 1130 where a display assembly 1140 can be mounted to the wall 1130. As shown, one or more cables 1132 (e.g., power cable and/or video cable) may be secured via the cable dock 200. FIG. 11B shows a side view of the LENOVO IDEACENTRE A720 computing device 1160 that includes a 27 inch frameless multi-touch display 1162, an arm 1164 that extends to a display base 1170 with a housing 1172 that includes a computer 1174 that includes one or more connectors 1176.

As an example, a cable dock can include a base that includes a series of cable bays, where each of the cable bays includes a corresponding well intersected by a cross-member, where the well and the cross-member form a cable tie passage for receipt of a cable tie (e.g., a tape portion of a cable tie).

As an example, a well can include a first curved surface where a cross-member includes a second curved surface, where the first curved surface and the second curved surface form a curved portion of a cable tie passage. In such an example, the first curved surface can include a U-shape and, for example, the second curved surface can include a portion of a cardioid shape. As an example, a first curved surface and a second curved surface can form a substantially semi-cylindrical portion of the cable tie passage.

As an example, a cable dock can include cable bays where each of the cable bays includes a platform and slanted sides that extend outwardly from the platform. In such an example, each of the slanted sides can include one or more cable detents. As an example, each of the slanted sides can include a corresponding cable tie opening for access to a cable tie passage. In such an example, each of the slanted sides can include two detents, where a corresponding cable tie opening is disposed between the two detents.

As an example, a platform of a cable bay can be formed by an upper surface of a cross-member. As an example, an angle between slanted sides of a cable bay can be greater than 45 degrees and less than 135 degrees. In such an example, the angle may be defined with respect to a vertex where, for example, a platform is disposed at a distance from the vertex where, for example, the width of the platform, extending between lines defined by the angle, can be approximately 0.1 mm to 10 mm or more, depending on an intended cable outer diameter or range of cable outer diameters.

As an example, a base can include a series of bottom side well openings. Where such a base is mounted to a surface, the openings may be closed such that, for example, a tape end of a cable tie does not pass through one of the openings as associated with a cable bay.

As an example, a cable dock can include a series of cable bays where the cable bays have at least two different cable bay sizes.

As an example, a cable dock can include a series of cable bays that includes a first end cable bay of a first size and a second end cable bay of a second size, where the first size and the second size differ. In such an example, the sizes may depend on ports (connector) sizes of an electronic device (e.g., a computer, a display, etc.). As an example, a cable dock can include a series of cable bays that includes at least four cable bays.

As an example, a system can include a display base that includes an arm; a display mounted to the arm; and a cable dock that includes a base that includes a series of cable bays, where each of the cable bays includes a corresponding well intersected by a cross-member, where the well and the cross-member form a cable tie passage for receipt of a cable tie. In such an example, the cable dock can be mounted to the display base. As an example, the display base can include connectors where, for example, the display base can include a lid positionable for access to the connectors. As an example, a system can include a power cable secured in one of the series of cable bays by a cable tie and a video cable secured in another one of the series of cable bays by another cable tie.

As an example, a system can include a computer that includes a base (e.g., a base housing); and a cable dock mounted to the base, where the cable dock includes a base that includes a series of cable bays, where each of the cable bays includes a corresponding well intersected by a cross-member, where the well and the cross-member form a cable tie passage for receipt of a cable tie.

As an example, a computer program product can include instructions to instruct a computing device, a computing system, etc., to perform one or more methods.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 12:
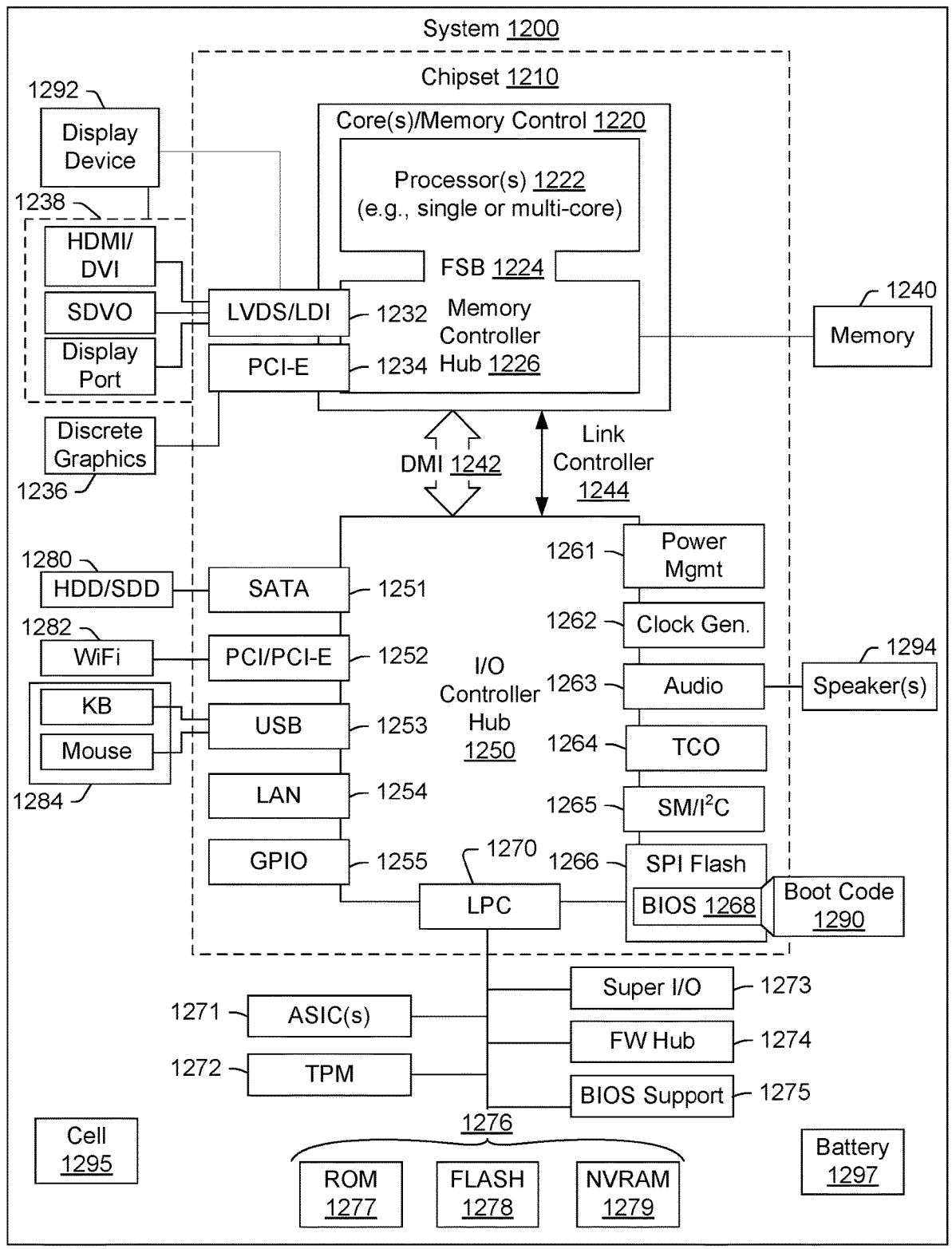
FIG. 12 is a diagram of an example of a system.

While various examples of circuits or circuitry have been discussed, FIG. 12 depicts a block diagram of an illustrative computer system 1200. The system 1200 may be a computer system sold by Lenovo (US) Inc. of Morrisville, NC (e.g., a THINKSTATION system, etc.); however, as apparent from the description herein, a satellite, a base, a display, a dock, a keyboard, a computing device, a hub device, a server or other machine may include one or more features and/or other features of the system 1200.

As an example, a monitor or display may include features such as one or more of the features included in one of the LENOVO IDEACENTRE or THINKCENTRE "all-in-one" (AIO) computing devices (e.g., sold by Lenovo (US) Inc. of Morrisville, NC). For example, the LENOVO IDEACENTRE A720 computing device includes an INTEL Core i7 processor, a 27 inch frameless multi-touch display (e.g., for HD resolution of 1920×1080), a NVIDIA GEFORCE GT 630M 2 GB graphics card, 8 GB DDR3 memory, a hard drive, a DVD reader/writer, integrated BLUETOOTH and 802.11b/g/n WI-FI, USB connectors, a 6-in-1 card reader, a webcam, HDMI in/out, speakers, and a TV tuner.

As shown in FIG. 12, the system 1200 includes a so-called chipset 1210. A chipset refers to a group of integrated circuits, or chips, that are designed to work together. Chipsets are usually marketed as a single product (e.g., consider chipsets marketed under the brands INTEL, AMD, etc.).

In the example of FIG. 12, the chipset 1210 has a particular architecture, which may vary to some extent depending on brand or manufacturer. The architecture of the chipset 1210 includes a core and memory control group 1220 and an I/O controller hub 1250 that exchange information (e.g., data, signals, commands, etc.) via, for example, a direct management interface or direct media interface (DMI) 1242 or a link controller 1244. In the example of FIG. 12, the DMI 1242 is a chip-to-chip interface (sometimes referred to as being a link between a "northbridge" and a "southbridge").

The core and memory control group 1220 include one or more processors 1222 (e.g., single core or multi-core) and a memory controller hub 1226 that exchange information via a front side bus (FSB) 1224. As described herein, various components of the core and memory control group 1220 may be integrated onto a single processor die, for example, to make a chip that supplants the conventional "northbridge" style architecture.

The memory controller hub 1226 interfaces with memory 1240. For example, the memory controller hub 1226 may provide support for DDR SDRAM memory (e.g., DDR, DDR2, DDR3, etc.). In general, the memory 1240 is a type of random-access memory (RAM). It is often referred to as "system memory".

The memory controller hub 1226 further includes a low-voltage differential signaling interface (LVDS) 1232. The LVDS 1232 may be a so-called LVDS Display Interface (LDI) for support of a display device 1292 (e.g., a CRT, a flat panel, a projector, etc.). A block 1238 includes some examples of technologies that may be supported via the LVDS interface 1232 (e.g., serial digital video, HDMI/DVI, display port). The memory controller hub 1226 also includes one or more PCI-express interfaces (PCI-E) 1234, for example, for support of discrete graphics 1236. Discrete graphics using a PCI-E interface has become an alternative approach to an accelerated graphics port (AGP). For example, the memory controller hub 1226 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1250 includes a variety of interfaces. The example of FIG. 12 includes a SATA interface 1251, one or more PCI-E interfaces 1252 (optionally one or more legacy PCI interfaces), one or more USB interfaces 1253, a LAN interface 1254 (more generally a network interface), a general purpose I/O interface (GPIO) 1255, a low-pin count (LPC) interface 1270, a power management interface 1261, a clock generator interface 1262, an audio interface 1263 (e.g., for speakers 1294), a total cost of operation (TCO) interface 1264, a system management bus interface (e.g., a multi-master serial computer bus interface) 1265, and a serial peripheral flash memory/controller interface (SPI Flash) 1266, which, in the example of FIG. 12, includes BIOS 1268 and boot code 1290. With respect to network connections, the I/O hub controller 1250 may include integrated gigabit Ethernet controller lines multiplexed with a PCI-E interface port. Other network features may operate independent of a PCI-E interface.

The interfaces of the I/O hub controller 1250 provide for communication with various devices, networks, etc. For example, the SATA interface 1251 provides for reading, writing or reading and writing information on one or more drives 1280 such as HDDs, SDDs or a combination thereof. The I/O hub controller 1250 may also include an advanced host controller interface (AHCI) to support one or more drives 1280. The PCI-E interface 1252 allows for wireless connections 1282 to devices, networks, etc. The USB interface 1253 provides for input devices 1284 such as keyboards (KB), one or more optical sensors, mice and various other devices (e.g., microphones, cameras, phones, storage, media players, etc.). On or more other types of sensors may optionally rely on the USB interface 1253 or another interface (e.g., I²C, etc.). As to microphones, the system 1200 of FIG. 12 may include hardware (e.g., audio card) appropriately configured for receipt of sound (e.g., user voice, ambient sound, etc.).

In the example of FIG. 12, the LPC interface 1270 provides for use of one or more ASICs 1271, a trusted platform module (TPM) 1272, a super I/O 1273, a firmware hub 1274, BIOS support 1275 as well as various types of memory 1276 such as ROM 1277, Flash 1278, and non-volatile RAM (NVRAM) 1279. With respect to the TPM 1272, this module may be in the form of a chip that can be used to authenticate software and hardware devices. For example, a TPM may be capable of performing platform authentication and may be used to verify that a system seeking access is the expected system.

The system 1200, upon power on, may be configured to execute boot code 1290 for the BIOS 1268, as stored within the SPI Flash 1266, and thereafter processes data under the control of one or more operating systems and application software (e.g., stored in system memory 1240). An operating system may be stored in any of a variety of locations and accessed, for example, according to instructions of the BIOS 1268. Again, as described herein, a satellite, a base, a server or other machine may include fewer or more features than shown in the system 1200 of FIG. 12. Further, the system 1200 of FIG. 12 is shown as optionally include cell phone circuitry 1295, which may include GSM, CDMA, etc., types of circuitry configured for coordinated operation with one or more of the other features of the system 1200. As shown, the system 1200 may include one or more batteries 1297 and, for example, battery management circuitry.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A cable dock comprising:
a base that comprises a series of cable bays, wherein each of the cable bays comprises a corresponding well intersected by a cross-member, wherein the well and the cross-member form a cable tie passage for receipt of a cable tie, wherein each of the cable bays comprises a platform and slanted sides that extend outwardly from the platform, wherein each of the slanted sides comprises a corresponding cable tie opening for access to the cable tie passage, wherein each of the slanted sides comprises two detents, and wherein the corresponding cable tie opening is disposed between the two detents.

2. The cable dock of claim 1, wherein the well comprises a first curved surface and wherein the cross-member comprises a second curved surface, wherein the first curved surface and the second curved surface form a curved portion of the cable tie passage.

3. The cable dock of claim 2, wherein the first curved surface comprises a U-shape.

4. The cable dock of claim 2, wherein the second curved surface comprises a portion of a cardioid shape.

5. The cable dock of claim 2, wherein the first curved surface and the second curved surface form a substantially semi-cylindrical portion of the cable tie passage.

6. The cable dock of claim 1, wherein the platform is formed by an upper surface of the cross-member.

7. The cable dock of claim 1, wherein an angle between the slanted sides is greater than 45 degrees and less than 135 degrees.

8. The cable dock of claim 1, wherein the base comprises a series of bottom side well openings.

9. The cable dock of claim 1, wherein the series of cable bays comprises at least two different cable bay sizes.

10. The cable dock of claim 1, wherein the series of cable bays comprises a first end cable bay of a first size and a second end cable bay of a second size, wherein the first size and the second size differ.

11. The cable dock of claim 1, wherein the series of cable bays comprises at least four cable bays.

12. The cable dock of claim 1, wherein each of the detents is a ridge that extends from a respective one of the slanted sides, wherein the ridge has a V-shape, and wherein a pointed edge of the ridge provides for contacting and indenting an elastomeric outer layer of a cable to hinder movement of the cable along a longitudinal axis of the cable.

13. The cable dock of claim 1, wherein a distance between a detent of one of the slated sides and an opposing one of the slanted sides is less near the platform and greater away from the platform.

14. The cable dock of claim 1, wherein the platform limits indentation of a cable by the detents upon forcibly seating one of the cable bays using a cable tie.

15. A system comprising:
a display base that comprises an arm;
a display mounted to the arm; and
a cable dock that comprises a base that comprises a series of cable bays, wherein each of the cable bays comprises a corresponding well intersected by a cross-member, wherein the well and the cross-member form a cable tie passage for receipt of a cable tie, wherein each of the cable bays comprises a platform and slanted sides that extend outwardly from the platform, wherein each of the slanted sides comprises a corresponding cable tie opening for access to the cable tie passage, wherein each of the slanted sides comprises two detents, and wherein the corresponding cable tie opening is disposed between the two detents.

16. The system of claim 15, wherein the cable dock is mounted to the display base.

17. The system of claim 16, wherein the display base comprises connectors.

18. The system of claim 15, comprising a power cable secured in one of the series of cable bays by a cable tie and a video cable secured in another one of the series of cable bays by another cable tie.

19. A system comprising:
a computer that comprises a housing; and
a cable dock mounted to the housing, wherein the cable dock comprises a base that comprises a series of cable bays, wherein each of the cable bays comprises a corresponding well intersected by a cross-member, wherein the well and the cross-member form a cable tie passage for receipt of a cable tie, wherein each of the cable bays comprises a platform and slanted sides that extend outwardly from the platform, wherein each of the slanted sides comprises a corresponding cable tie opening for access to the cable tie passage, wherein each of the slanted sides comprises two detents, and wherein the corresponding cable tie opening is disposed between the two detents.

* * * * *